United States Patent
Mozak et al.

(10) Patent No.: US 9,542,123 B2
(45) Date of Patent: Jan. 10, 2017

(54) DISABLING A COMMAND ASSOCIATED WITH A MEMORY DEVICE

(71) Applicant: Intel Corporation, Santa Clara, CA (US)

(72) Inventors: Christopher P. Mozak, Beaverton, OR (US); Kuljit S. Bains, Olympia, WA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/952,324

(22) Filed: Nov. 25, 2015

(65) Prior Publication Data

US 2016/0188257 A1 Jun. 30, 2016

Related U.S. Application Data

(63) Continuation of application No. 14/230,338, filed on Mar. 31, 2014, now Pat. No. 9,213,491.

(51) Int. Cl.
*G06F 12/00* (2006.01)
*G06F 13/00* (2006.01)
*G06F 3/06* (2006.01)

(52) U.S. Cl.
CPC ............ *G06F 3/0659* (2013.01); *G06F 3/061* (2013.01); *G06F 3/068* (2013.01); *G06F 3/0619* (2013.01);
(Continued)

(58) Field of Classification Search
None
See application file for complete search history.

(56) References Cited

U.S. PATENT DOCUMENTS 5,887,162 A * 3/1999 Williams ............... G11C 5/066
 710/10
9,202,595 B2 * 12/2015 Wilson .................. G11C 29/76
(Continued)

FOREIGN PATENT DOCUMENTS

| EP | 1939887 A1 | 7/2008 |
| TW | 200703346 | 1/2007 |
| WO | 2015053649 | 10/2015 |

OTHER PUBLICATIONS

International Search Report and Written Opinion received for PCT Patent Application No. PCT/US2015/023651, mailed on Jun. 19, 2015, 14 pages.

*Primary Examiner* — Sean D Rossiter
(74) *Attorney, Agent, or Firm* — Compass IP Law

(57) ABSTRACT

In an embodiment, a memory device may contain device processing logic and a mode register. The mode register may a register that may specify a mode of operation of the memory device. A field in the mode register may hold a value that may indicate whether a command associated with the memory device is disabled. The value may be held in the field until either the memory device is power-cycled or reset. The device processing logic may acquire an instance of the command. The device processing logic may determine whether the command is disabled based on the value held by the mode register. The device processing logic may not execute the instance of the command if the device processing logic determines the command is disabled. If the device processing logic determines the command is not disabled, the device processing logic may execute the instance of the command.

19 Claims, 6 Drawing Sheets

(52) U.S. Cl.
CPC ........... *G06F 3/0625* (2013.01); *G06F 3/0634*
(2013.01); *G06F 3/0673* (2013.01)

(56) References Cited

U.S. PATENT DOCUMENTS

| | | | |
|---|---|---|---|
| 9,349,491 B1* | 5/2016 | Morgan | G11C 29/76 |
| 2004/0039883 A1 | 2/2004 | Laberge et al. | |
| 2005/0007835 A1* | 1/2005 | Lee | G11C 5/00 |
| | | | 365/189.12 |
| 2007/0133323 A1* | 6/2007 | Kim | G11C 29/789 |
| | | | 365/200 |
| 2007/0291575 A1 | 12/2007 | Lee et al. | |
| 2008/0247243 A1 | 10/2008 | Kang et al. | |
| 2008/0263392 A1 | 10/2008 | Fujiwara et al. | |
| 2011/0153939 A1* | 6/2011 | Choi | G06F 13/1668 |
| | | | 711/118 |
| 2011/0176371 A1* | 7/2011 | Jang | G11C 5/04 |
| | | | 365/189.05 |
| 2013/0290389 A1 | 10/2013 | Miller et al. | |
| 2014/0064014 A1* | 3/2014 | Cho | G11C 5/066 |
| | | | 365/230.08 |
| 2015/0135038 A1* | 5/2015 | Wilson | G11C 29/76 |
| | | | 714/773 |
| 2015/0287480 A1* | 10/2015 | Wilson | G11C 29/70 |
| | | | 365/96 |
| 2015/0348650 A1* | 12/2015 | Song | G11C 29/44 |
| | | | 365/191 |
| 2016/0042805 A1* | 2/2016 | Park | G11C 17/16 |
| | | | 365/96 |
| 2016/0111171 A1* | 4/2016 | Yang | G11C 29/78 |
| | | | 365/96 |
| 2016/0180969 A1* | 6/2016 | Noh | G11C 29/78 |
| | | | 365/96 |
| 2016/0217873 A1* | 7/2016 | Noh | G11C 11/4074 |

* cited by examiner

DISABLING A COMMAND ASSOCIATED WITH A MEMORY DEVICE

RELATED CASE

This application is continuation of U.S. patent application Ser. No. 14/230,338 which was filed on Mar. 31, 2014.

BACKGROUND

Command training for a dynamic random access memory (DRAM) device may be performed to train a command bus associated with the device. Training may involve testing the command bus using functional write/read traffic while margining timing or voltage. If during training a failure is detected, it is usually assumed the DRAM device is in a bad state and must do a complete reset. An issue with certain memory devices may be that a bad command may accidently be received as a post package repair (PPR) command. The PPR command may enable burning row replacement fuses in the memory devices. Accidently burning a fuse may create several possible issues, including permanently consuming precious PPR resources (leading to no resources left for real repairs), incomplete row fusing creating downstream failure, and putting the memory device in an undefined state that reset does not recover.

BRIEF DESCRIPTION OF THE DRAWINGS

The accompanying drawings, which are incorporated in and constitute a part of this specification, illustrate one or more embodiments described herein and, together with the description, explain these embodiments. In the drawings.

DETAILED DESCRIPTION

Figure 1:
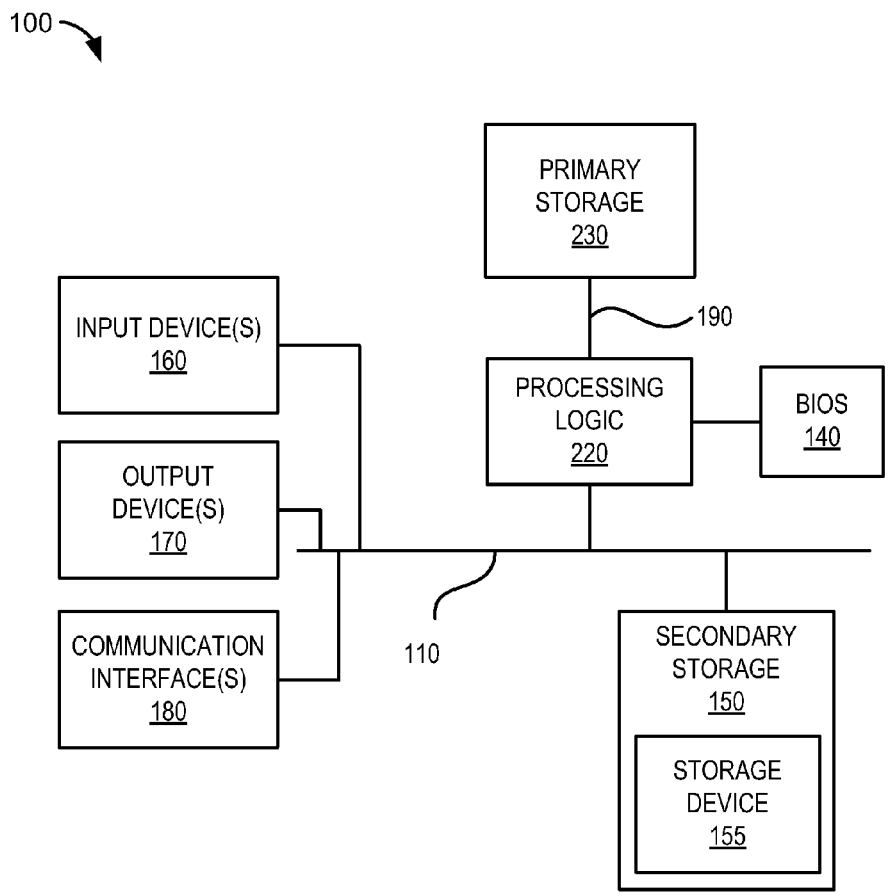
FIG. 1 illustrates a block diagram of an example embodiment of a computing device.

The following detailed description refers to the accompanying drawings. The same reference numbers in different drawings may identify the same or similar elements. Also, the following detailed description does not limit the invention.

A computing device may include, for example, a processing logic and storage. The processing logic may include logic (e.g., hardware) that may execute and/or manipulate information that may be stored in the storage. The information may include, for example, data and/or computer-executable instructions.

The storage may include one or more memory devices that may be used to store the information. The storage may be volatile and/or non-volatile. A storage that is volatile may lose information stored in the storage when power is removed from the storage. A storage that is non-volatile may retain information in the storage when power is removed from the storage. A storage that is volatile may be referred to as a volatile storage and a storage that is non-volatile may be referred to as a non-volatile storage.

For example, a computing device may contain a processor and storage. The storage may include one or more memory devices that may be used to store information. The information may include, for example, data that may be manipulated by the processor and/or computer-executable instructions that may be executed by the processor.

The memory devices may provide a volatile and/or non-volatile storage for the computing device. Information that is to persist after power is removed from the computing device may be stored in memory devices that may provide a non-volatile storage for the computing device. Information stored in memory devices that provide a volatile storage for the computing device may be lost after power is removed from the computing device.

A computing device may include a memory controller which may be used to interface processing logic contained in the computing device with one or more memory devices contained in the computing device. The memory controller may generate and issue (e.g., send) one or more instances of commands to the memory devices to perform various operations.

For example, a processor may write data to a location in a storage. A storage area for storing the data at that the location may be provided by multiple memory devices contained in the storage. The processor may include a memory controller which may generate and issue one or more instances of commands to the memory devices to write the data into the memory devices.

Memory devices may support various types of commands. The commands may include, for example, standard commands and/or vendor specific commands. Standard commands may include commands that may be specified by an industry standard. For example, the Joint Electron Device Engineering Council (JEDEC) Solid State Technology Association has developed various industry standards for memory devices. An example of a standard developed by JEDEC includes JESD79-4 which defines a minimum set of requirements for fourth generation double data rate (DDR4) memory devices.

A vendor specific command may be a non-standard command that may be defined, for example, by a particular vendor of a memory device. Since the commands may be defined by the vendor, functions associated with the command may or may not be documented. Thus, issuing an instance of a vendor specific command to a memory device may place the memory device in an unknown state.

For example, a memory device from a particular vendor may include support for a vendor specific command only known to that vendor that places the command in a vendor defined mode of operation. Issuing an instance of the vendor specific command to the memory device may cause the memory device to execute the instance of the command which may place the memory device in the vendor defined mode of operation. Since the mode of operation is non-standard, it may not be apparent what mode the memory device is in and therefore the device may be considered in an unknown state.

Commands supported by a memory device may include, for example, a post package repair (PPR) command. The PPR command may be used to repair the memory device after, for example, the memory device has been packaged. Repair may include irreversibly altering logic in the memory device in order to repair the device.

For example, suppose a memory device contains one or more spare rows of memory cells that may be used to store information in the memory device. Further, suppose that the memory device supports a PPR command that enables a currently used row to be irreversibly remapped to one of the spare rows.

Now suppose the memory device contains a bad memory cell in a currently used row. An instance of the PPR command may be issued to the memory device to remap the currently used row to one of the spare rows. The memory device may acquire (e.g., read, receive) the instance of the PPR command and process it. Processing may include irreversibly remapping the currently used row that contains the bad memory cell to one of the spare rows in order to repair the memory device and cause the memory device to no longer use the row that contains the bad memory cell.

Instances of various commands may be issued to a memory device at various times and for various reasons. For example, after a computing device is powered on, a memory controller associated with the computing device may issue instances of various commands to one or more memory devices to, for example, train and/or test a command bus that may be used to convey the instances of the commands from the memory controller to the memory devices.

A problem may arise if an instance of a command issued to the memory device is misinterpreted by the memory device as, for example, a vendor specific command or a PPR command. For example, suppose a training sequence between a memory controller and a memory device involves sending various instances of commands between the memory controller and the memory device. Further, suppose that during the training sequence the memory device misinterprets one of instances of the commands as a PPR command.

In processing the misinterpreted instance of the command, the memory device may inadvertently remap a row of memory cells with an available spare row of memory cells. This unnecessary remapping may, in turn, lead to an unnecessary consumption of valuable resources associated with the memory device, i.e., unnecessary consumption of limited available rows of spare memory cells. One or more techniques described herein may obviate, for example, problems that may arise when instances of commands are misinterpreted by a memory device.

One or more techniques described herein may be implemented in a computing device. Examples of computing devices that may implement one or more techniques described herein include, but are not limited to, a smart phone, tablet, desktop computer, or ultrabook. FIG. 1 illustrates a block diagram of an example embodiment of a computing device 100 that may implement one or more techniques described herein.

Referring to FIG. 1, computing device 100 may include various components such as, for example, processing logic 220, primary storage 230, a basic input/output system (BIOS) 140, secondary storage 150, one or more input devices 160, one or more output devices 170, and one or more communication interfaces 180.

It should be noted that FIG. 1 illustrates an example embodiment of a computing device that may implement one or more techniques described herein. Other embodiments of computing devices that may implement one or more techniques described herein may include more components or fewer components than the components illustrated in FIG. 1. Further, the components may be arranged differently than as illustrated in FIG. 1.

For example, in an embodiment of a computing device that may implement one or more techniques described herein, a portion of secondary storage 150 may be contained at a remote site that provides "cloud" storage. The site may be accessible to the computing device via a communications network, such as, for example, the Internet. A communication interface 180 may be used to interface the computing device with the communications network.

Also, it should be noted that functions performed by various components contained in other embodiments of computing devices that may implement one or more techniques described herein may be distributed among the components differently than as described herein.

Computing device 100 may include an input/output (I/O) bus 110 that may enable communication among components in computing device 100 such as, for example, processing logic 220, secondary storage 150, one or more input devices 160, one or more output devices 170, and/or one or more communication interfaces 180. The communication may include, among other things, transferring, for example, data and/or control signals between the components. Examples of I/O busses that may be used to implement I/O bus 110 include, but are not limited to, the serial AT attachment (SATA) bus, peripheral component interconnect (PCI) bus, PCI express (PCI-e) bus, universal serial bus (USB), small computer system interface (SCSI) bus, and the serial attached SCSI (SAS) bus.

Computing device 100 may include a bus 190 that may enable information, which may be stored in primary storage 230, to be transferred between processing logic 220 and primary storage 230. The information may include, for example, computer-executable instructions and/or data that may be executed, manipulated, and/or otherwise processed by processing logic 220.

Bus 190 may also include provisions for transferring instances of one or more commands between a memory controller that may be contained in processing logic 220 and one or more memory devices that may be contained in primary storage 230. Examples of a memory controller that may be contained in processing logic 220 and memory devices that may be contained in primary storage 230 will be discussed further below.

Processing logic 220 may include logic for interpreting, executing, and/or otherwise processing information. The information may include information that may be stored in, for example, primary storage 230 and/or secondary storage 150. In addition, the information may include information that may be acquired by one or more input devices 160 and/or communication interfaces 180.

Processing logic 220 may include a variety of heterogeneous hardware. The hardware may include, for example, some combination of one or more processors, microprocessors, field programmable gate arrays (FPGAs), application specific instruction set processors (ASIPs), application specific integrated circuits (ASICs), complex programmable logic devices (CPLDs), graphics processing units (GPUs), and/or other types of processing logic that may, for example, interpret, execute, manipulate, and/or otherwise process information. Processing logic 220 may comprise a single core or multiple cores. Examples of processors that may be used to implement processing logic 220 include, but are not limited to, the Intel® Xeon® processor and Intel® Atom™ brand processors which are available from Intel Corporation, Santa Clara, Calif.

Input devices 160 may include one or more devices that may be used to input information into computing device 100. These devices may include, for example, a keyboard, computer mouse, microphone, camera, trackball, gyroscopic device (e.g., gyroscope), mini-mouse, touch pad, stylus, graphics tablet, touch screen, joystick (isotonic or isometric), pointing stick, accelerometer, palm mouse, foot mouse, puck, eyeball controlled device, finger mouse, light pen, light gun, neural device, eye tracking device, steering wheel, yoke, jog dial, space ball, directional pad, dance pad, soap mouse, haptic device, tactile device, neural device, multipoint input device, discrete pointing device, and/or some other input device.

The information may include, for example, spatial (e.g., continuous, multi-dimensional) data that may be input into computing device 100 using, for example, a pointing device, such as a computer mouse. The information may also include other forms of data, such as, for example, text that may be input using a keyboard.

Output devices 170 may include one or more devices that may output information from computing device 100. These devices may include, for example, a cathode ray tube (CRT), plasma display device, light-emitting diode (LED) display device, liquid crystal display (LCD) device, vacuum florescent display (VFD) device, surface-conduction electron-emitter display (SED) device, field emission display (FED) device, haptic device, tactile device, printer, speaker, video projector, volumetric display device, plotter, touch screen, and/or some other output device.

Output devices 170 may be directed by, for example, processing logic 220, to output the information from computing device 100. Outputting the information may include presenting (e.g., displaying, printing) the information on an output device 170. The information may include, for example, text, graphical user interface (GUI) elements (e.g., windows, widgets, and/or other GUI elements), audio (e.g., music, sounds), and/or other information that may be outputted by output devices 170.

Communication interfaces 180 may include logic for interfacing computing device 100 with, for example, one or more communications networks and enable computing device 100 to communicate with one or more entities (e.g., nodes) coupled to the communications networks. The communications networks may include, for example, the Internet, wide-area networks (WANs), local area networks (LANs), 3G and/or 4G networks.

Communication interfaces 180 may include one or more transceiver-like mechanisms that may enable computing device 100 to communicate with entities coupled to the communications networks. Examples of communication interfaces 180 may include a built-in network adapter, network interface card (NIC), Personal Computer Memory Card International Association (PCMCIA) network card, card bus network adapter, wireless network adapter, Universal Serial Bus (USB) network adapter, modem, and/or other device suitable for interfacing computing device 100 to a communications network.

Primary storage 230 and secondary storage 150 may include one or memory devices that may be used to store information for computing device 100. A memory device may support, for example, serial or random access to information stored in the memory device. A memory device that supports serial access to information stored in the memory device may be referred to as a serial memory device. A memory device that supports random access to information stored in the memory device may be referred to as a random access memory (RAM) device.

A memory device may be, for example, a volatile memory device or a non-volatile memory device. A volatile memory device may be a memory device that may lose information stored in the device after power is removed from the memory device. A non-volatile memory device may be a memory device that may retain information stored in the memory device after power is removed from the memory device.

Examples of memory devices that may be used in computing device 100 include, but are not limited to, a dynamic RAM (DRAM) device, flash memory device, static RAM (SRAM) device, zero-capacitor RAM (ZRAM) device, twin transistor RAM (TTRAM) device, read-only memory (ROM) device, ferroelectric transistor RAM (FeTRAM) device, magneto-resistive RAM (MRAM) device, phase change memory (PCM) device, PCM and switch (PCMS) device, nanowire-based device, resistive RAM memory (RRAM) device, and electrically erasable programmable ROM (EEPROM) device.

Primary storage 230 may be accessible to processing logic 220 via memory bus 190. Primary storage 230 may store computer-executable instructions and/or data that may be associated with (e.g., implement) an operating system (OS) and/or a software application. The computer-executable instructions may be executed, interpreted, and/or otherwise processed by processing logic 220.

Primary storage 230 may be implemented using one or more memory devices that may store information for processing logic 220. The information may include executable instructions that may be executed by processing logic 220. The information may also include data that may be manipulated by processing logic 220. The memory devices may include volatile and/or non-volatile memory devices.

As noted above, primary storage 230 may store computer-executable instructions associated with an OS. The OS may be a conventional operating system that may implement various conventional operating system functions. These functions may include, for example, (1) scheduling one or more portions of a software application to be executed by the processing logic 220, (2) managing primary storage 230, and (3) controlling access to various components in computing device 100 (e.g., input devices 160, output devices 170, communication interfaces 180, secondary storage 150) and information received and/or transmitted by these components.

Examples of operating systems that may be used include, but are not limited to, the Linux operating system, Microsoft Windows operating system, the Symbian operating system, Mac OS operating system, iOS operating system, Chrome OS and the Android operating system. A distribution of the Linux operating system that may be used is Red Hat Linux available from Red Hat Corporation, Raleigh, N.C. Versions of the Microsoft Windows operating system that may be used include Microsoft Windows Mobile, Microsoft Windows 8.1, Microsoft Windows 8, Microsoft Windows 7, Microsoft Windows Vista, and Microsoft Windows XP operating systems available from Microsoft Inc., Redmond, Wash. The Symbian operating system is available from Accenture PLC, Dublin, Ireland. The Mac OS and iOS operating systems are available from Apple, Inc., Cupertino, Calif. The Chrome OS and Android operating systems are available from Google, Inc., Menlo Park, Calif.

Also as noted above, primary storage 230 may store computer-executable instructions that may be associated with a software application. The application may run (execute) under control of an OS that may execute on computing device 100. The application and/or OS may contain provisions for performing various operations such as, for example, retrieving information (e.g., from secondary storage 150) and outputting (e.g., displaying) the information on an output device 170. These provisions may be implemented using data and/or computer-executable instructions contained in the application and/or OS.

Secondary storage 150 may provide a secondary storage for information that may be used by computing device 100. The information may include data that may be manipulated by processing logic 220. The information may also include computer-executable instructions that may be transferred to primary storage 230 prior to being executed by processing logic 220.

Secondary storage 150 may include a storage device 155 that may be used to store the information. The storage device 155 may be accessible to processing logic 220 via I/O bus 110. The storage device 155 may store some or all of information.

The storage device 155 may include a volatile and/or non-volatile storage for storing the information. Examples of devices that may be used to implement storage device 155 include, but are not limited to, a magnetic disk drive, optical disk drive, random-access memory (RAM) disk drive, flash drive, thumb drive, solid-state disk drive SSD, and hybrid drive.

Information stored by storage device 155 may be stored on one or more non-transitory tangible computer-readable media contained in the storage device 155. Examples of non-transitory tangible computer-readable media that may be contained in storage device 155 may include magnetic discs, optical discs, volatile memory devices, and/or non-volatile memory devices.

BIOS 140 may include, for example, firmware that may be used to initialize one or more portions of computing device 100. The firmware may include computer-executable instructions that when executed may, for example, train and/or test one or more portions of bus 190.

For example, as noted above, bus 190 may be used to transfer instances of commands between a memory controller that may be contained in processing logic 220 and one or more memory devices that may be contained in primary storage 230. Firmware contained in BIOS 140 may include computer-executable instructions that when executed by processing logic 220 may, for example, cause one or more instances of commands to be generated and/or issued by the memory controller to the memory devices via bus 190. The instances of the commands may be used to train the memory controller and/or the memory devices so that future instances of commands may be successfully transferred between the memory controller and the memory devices without error.

BIOS 140 may also incorporate one or more techniques firmware that may be used to disable execution of certain instances of commands in one or more memory devices that may be contained in primary storage 230. Details of these techniques will be discussed further below.

Figure 2:
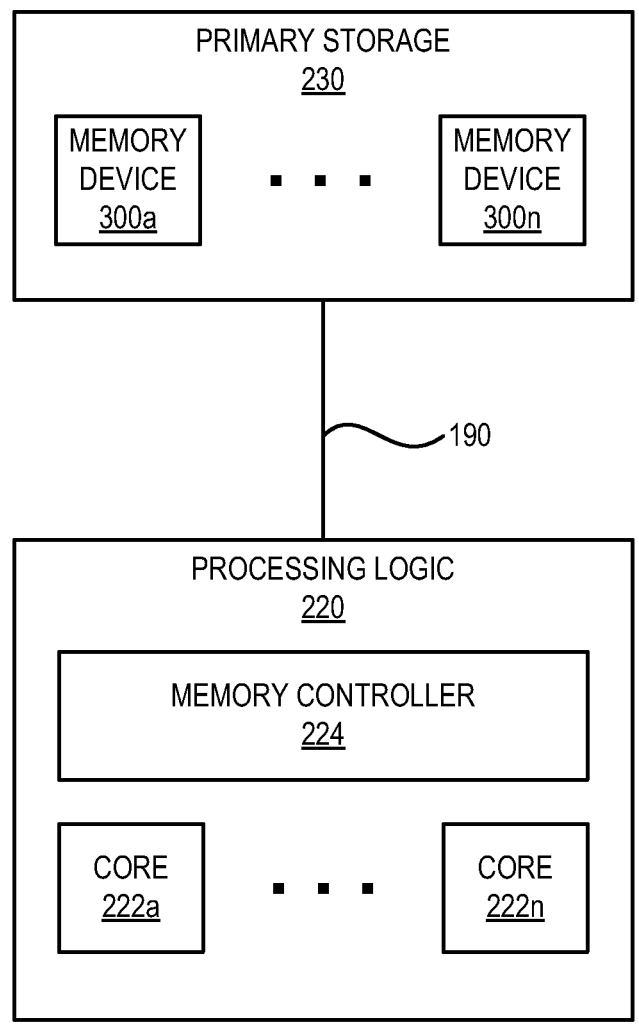
FIG. 2 illustrates an example embodiment of processing logic and primary storage that may be contained in a computing device.

FIG. 2 illustrates an example embodiment of processing logic 220 and primary storage 230. Referring to FIG. 2, processing logic 220 may include one or more cores 222a-n and a memory controller 224. Primary storage may include one or more memory devices 300a-n.

The cores 222a-n may contain logic that may implement, for example, general-purpose processor cores and/or graphics processor cores. The logic may interpret, execute, manipulate and/or otherwise process information contained in, for example, primary storage 230, secondary storage 150, and/or BIOS 140.

Memory controller 224 may include logic that may, for example, interface the cores 222a-n with primary storage 230 and enable information and/or instances of commands to be transferred between the cores 222a-n and memory devices 300a-n. The information may include, for example, data and/or computer-executable instructions that may be processed (e.g., executed, manipulated) by the cores 222a-n. The instances of commands may include, for example, instances of commands that may direct one or more of the memory devices 300a-n to perform various operations. For example, the instances of commands may include an instance of a PPR command that may be used to direct a memory device 300 to remap a row of memory cells contained in the memory device 300 such as described above.

A memory device 300 may include logic that may be used to store information for computing device 100. The information may include, for example, data and/or computer-executable instructions such as described above.

A memory device 300 may be contained on a memory module that may be part of primary storage 230. For example, one more of the memory devices 300a-n may be contained on a dual-inline memory module (DIMM) and/or a single inline memory module (SIMM) that may be contained in primary storage 230. The memory module may plug into a socket which may provide an electrical connection between the memory devices 300 and bus 190.

A memory device 300 may provide a volatile and/or non-volatile storage for information stored in the memory device 300. Examples of memory devices that may be used to implement a memory device 300 may include, but are not limited to, DRAM devices, flash memory devices, SRAM devices, ZRAM devices, TTRAM devices, FeTRAM devices, MRAM devices, PCM devices, PCMS devices, nanowire-based devices, RRAM devices, and EEPROM devices. For example, memory device 300 may be a low-power fourth generation double data rate (LPDDR4) DRAM device.

Figure 3:
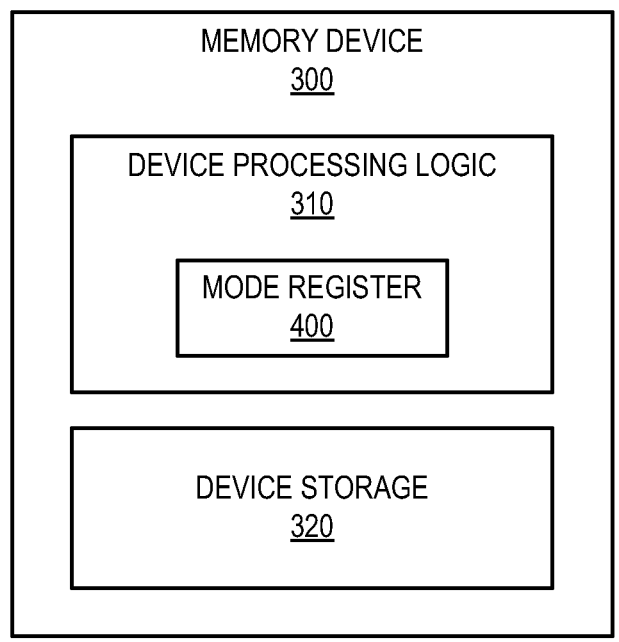
FIG. 3 illustrates an example embodiment of a memory device.

FIG. 3 illustrates an example embodiment of memory device 300. Referring to FIG. 3, memory device 300 may include, for example, device processing logic 310 and a device storage 320.

Device storage 320 may include logic that may store information in memory device 300. The logic may include, for example, one or more memory cells that may store the information. Device storage 320 may provide a non-volatile storage and/or volatile storage for the information.

Device processing logic 310 may include logic that may process instances of commands, information, and/or signals (e.g., control signals) that may be acquired by the memory device from memory controller 224. The processing may include, for example, executing various instances of the commands that may be transferred from memory controller 224 to the memory device 300 via bus 190.

Figure 4:
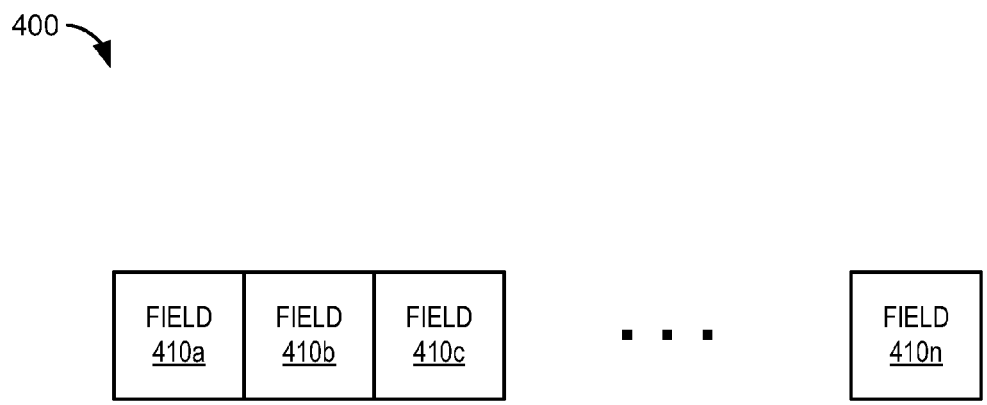
FIG. 4 illustrates an example embodiment of a mode register that may be associated with a memory device.

Device processing logic 310 may include a mode register 400. Mode register 400 may be a register that may be used to specify a mode of operation for one or more portions of memory device 300. FIG. 4 illustrates an example embodiment of mode register 400.

Referring to FIG. 4, mode register 400 may include one or more fields 410a-n. A field 410 may be used to specify a mode of operation for the memory device 300. For example, as well be described further below, a field 410 may be used to specify whether a command is disabled in the memory device 300. It should be noted that a field 410 may be used for other purposes that may be associated with memory device 300. For example, a field 410 may be used to specify a column address strobe (CAS) latency associated with the memory device 300 or a burst length associated with the memory device 300.

Mode register 400 may include a field 410 that may be used to disable one or more commands associated with the memory device 300. The field 410 may be sticky in that a value held by the field may remain until a particular event associated with memory device 300 occurs (e.g., the memory device 300 is reset, the memory device 300 is power-cycled).

For example, suppose the memory device 300 supports execution of the PPR command. A field 410 in mode register 400 may include a bit that when asserted (e.g., set to one) may indicate that execution of the PPR command is disabled for the memory device 300. After the bit is asserted, an instance of a PPR command received by the memory device 300 may cause device processing logic 310 associated with the memory device 300 to not execute the instance of the PPR command. The bit may remain asserted and execution of the PPR command may remain disabled for the memory device 300 until the memory device 300 is, for example, reset or power-cycled. For example, the memory device 300 may support a Reset_N signal which when asserted may reset the memory device 300. The bit may remain asserted and the PPR command may remain disabled for the memory device 300 until the Reset_N signal is asserted.

Note that other commands associated with the memory device 300 may be disabled in a similar manner. For example, the memory device 300 may support various vendor specific commands. One or more fields 410 may be used, for example, as described above to disable execution of one or more instances of the supported vendor specific commands that may be acquired by the memory device 300. A field 410 that may be used to disable a command associated with a memory device 300 may be considered sticky in that the command may remain disabled until a certain event associated with the memory device 300 occurs.

A memory device such as, for example, memory device 300, may acquire an indication to disable a command that may be supported by the memory device 300. After acquiring the indication, the memory device may disable the command. Disabling the command may include, for example, the memory device not executing instances of the command that may be later acquired by the memory device.

Figure 5:
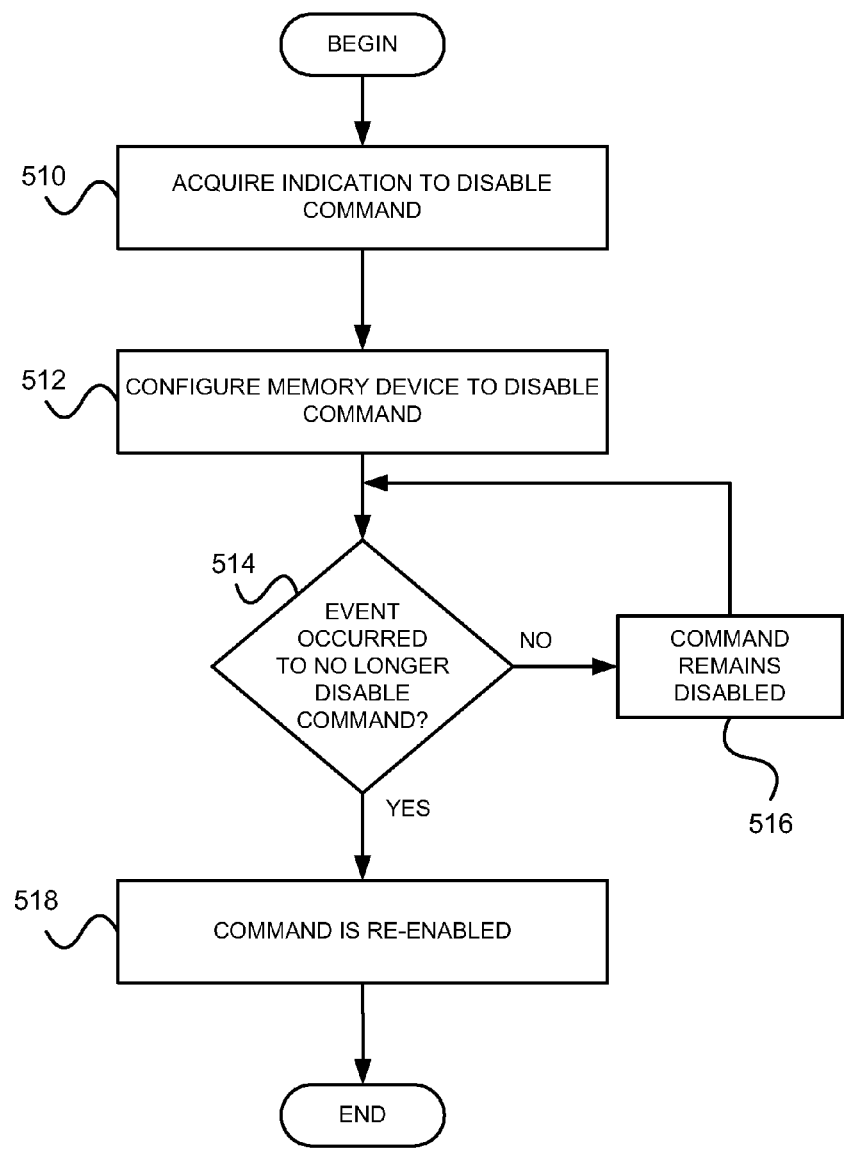
FIG. 5 illustrates a flow diagram of example acts that may be performed to disable a command associated with a memory device.

FIG. 5 illustrates a flow diagram of example acts that may be performed to disable a command in a memory device such as, for example, memory device 300. Referring to FIG. 5, at block 510, an indication may be acquired to disable a command in the memory device. The indication may include, for example, a value that when set into a field of a mode register associated with the memory device may cause the command to be disabled for that memory device.

At block 512, the memory device is configured to disable the command. Configuring the memory device to disable the command may include, for example, setting a value in a field in mode register associated with the memory device to indicate that the command is disabled.

At block 514, a check is performed to determine whether an event has occurred to no longer cause the command to be disabled. If the event did not occur, at block 516 the command may remain disabled. If the event did occur, at block 518, the command is no longer disabled for the memory device.

For example, referring to FIGS. 1-5, suppose that a memory device 300 in computing device 100 supports the PPR command. Further, suppose that the memory device 300 includes a mode register 400 that contains a field 410 that when set to a certain value may cause the PPR command to be disabled in the memory device 300.

Processing logic 220 may execute one or more computer-executable instructions contained in BIOS 140 that may cause memory controller 224 to generate a value that when set into the field 410 may cause the PPR command to be disabled in the memory device 300. In addition, the memory controller 224 may generate an instance of a command (e.g., a mode register write (MRW) command) that may be used to direct the memory device 300 to set the value into the field 410. The instance of the command and the value may be transferred from the memory controller 224 to the memory device 300 via bus 190. Memory device 300 may acquire the instance of the command and the value from the bus 190. Device processing logic 310 associated with memory device 300 may process the instance of the command and the value. The processing may include configuring the memory device 300 to disable the PPR command by, for example, setting the value into the field 410 to indicate that the PPR command is disabled for the memory device 300.

Now suppose an event occurs that causes the command to no longer be disabled. The event may include, for example, power-cycling the memory device 300 or resetting the memory device 300. The occurrence of the event may cause the memory device to no longer be in a state where the command is disabled. Thus, in the above example, after power-cycling the memory device or resetting the memory device 300, the value of the field 410 in the mode register 400 may be set to indicate that the PPR command is not disabled.

Figure 6:
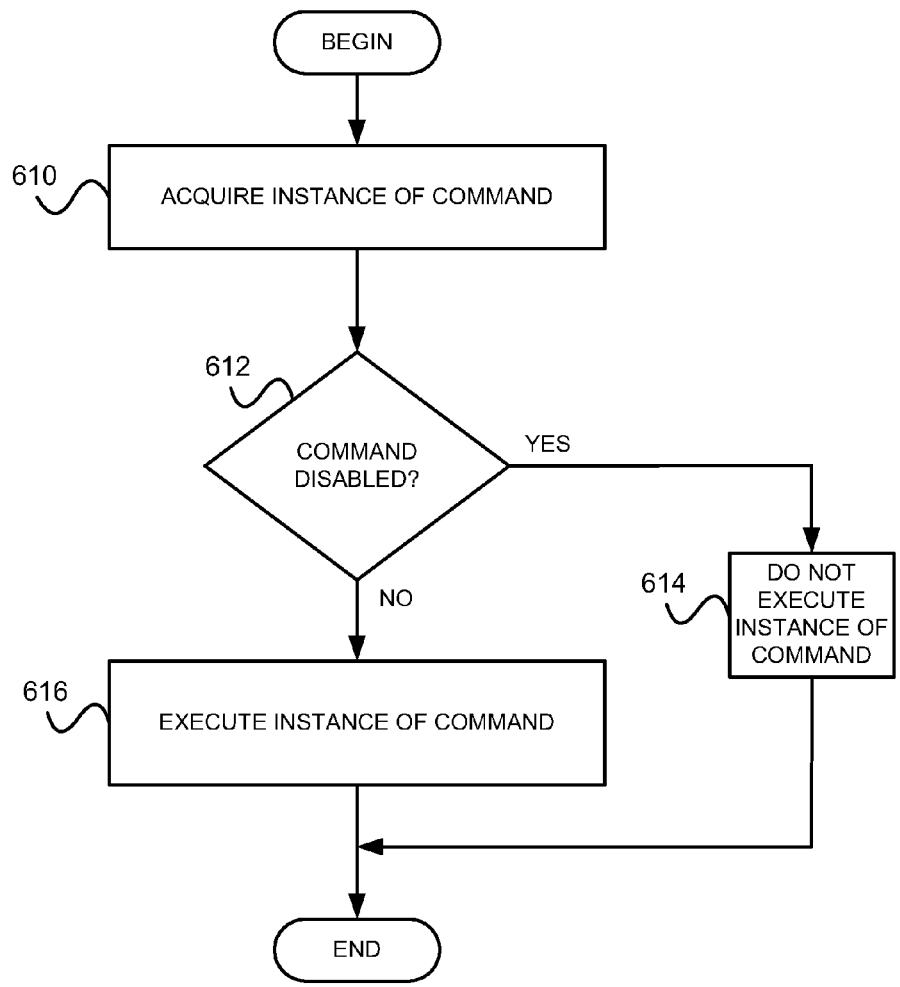
FIG. 6 illustrates a flow diagram of example acts that may be performed by a memory device to process an instance of a command that has been disabled.

After a memory device is configured to disable execution of a particular command, if an instance of the particular command is acquired by the memory device, the memory device may not, for example, execute the instance of the command. FIG. 6 illustrates a flow diagram of example acts that may be performed by a memory device to process an instance of a command that has been disabled.

Referring to FIG. 6, at block 610 the instance of the command is acquired. The instance of the command may be acquired, for example, by reading the instance of the command from a bus such as, for example, bus 190.

At block 612, a check is performed to determine whether the command is disabled. If it is determined that the command is disabled, at block 614, the instance of the command is not executed. If it is determined that the command is not disabled, at block 616 the instance of the command is executed.

For example, referring to FIGS. 1-4 and 6, suppose that a memory device 300 in computing device 100 supports the PPR command. Further, suppose that the memory device 300 includes a mode register 400 and that the mode register 400 contains a field 410 that when set to a particular value disables execution of instances of the PPR command. Now suppose that the field 410 is set to indicate that the PPR command is disabled.

Processing logic 220 may execute various instructions contained in BIOS 140 that may cause various instances of commands to be generated by memory controller 224. The generated instances of the commands may be transferred from memory controller 224 via the bus 190 to the memory device 300. The device processing logic 310 associated with the memory device 300 may acquire the instances of the commands and process them.

Now suppose that an acquired instance of a command is interpreted by the device processing logic 310 as a PPR command. The device processing logic 310 may examine the field 410 in the mode register 400 and determine that the field 410 indicates that the PPR command is disabled.

After determining the PPR command is disabled, the device processing logic 310 may not execute the instance of the command. Not executing the instance of the command may include, for example, ignoring the instance of the command, discarding the instance of the command, and/or some other function that may be associated with not executing the instance of the command.

The foregoing description of embodiments is intended to provide illustration and description, but is not intended to be exhaustive or to limit the invention to the precise form disclosed. Modifications and variations are possible in light of the above teachings or may be acquired from practice of the invention. For example, while a series of acts has been described above with respect to FIGS. 5 and 6, the order of the acts may be modified in other implementations. Further, non-dependent acts may be performed in parallel.

Also, the term "user", as used herein, is intended to be broadly interpreted to include, for example, a computing device (e.g., fixed computing device, mobile computing device) or a user of a computing device, unless otherwise stated.

It will be apparent that one or more embodiments, described herein, may be implemented in many different forms of software and/or hardware. Software code and/or specialized hardware used to implement embodiments described herein is not limiting of the invention. Thus, the operation and behavior of embodiments were described without reference to the specific software code and/or specialized hardware—it being understood that one would be able to design software and/or hardware to implement the embodiments based on the description herein.

Further, certain features of the invention may be implemented using computer-executable instructions that may be executed by processing logic such as, for example, device processing logic 310. The computer-executable instructions may be stored on one or more non-transitory tangible computer-readable storage media. The media may be volatile or non-volatile and may include, for example, DRAM storage, SRAM storage, and/or flash memory storage.

No element, act, or instruction used herein should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

It is intended that the invention not be limited to the particular embodiments disclosed above, but that the invention will include any and all particular embodiments and equivalents falling within the scope of the following appended claims.

What is claimed is:

1. A memory device comprising:
   a mode register to contain a value to indicate whether a post package repair (PPR) command is disabled for the memory device; and
   device processing logic to:
      acquire an instance of the PPR command, and
      selectively execute or discard the instance of the PPR command based in part on the value in the mode register.

2. The memory device of claim 1, wherein the device processing logic is to further:
   discard the instance of the PPR command based in part on a determination that the value in the mode register indicates the PPR command is disabled.

3. The memory device of claim 1, wherein the device processing logic is to further:
   execute the instance of the PPR command based in part on a determination that the value in the mode register indicates the command is not disabled.

4. The memory device of claim 1, wherein the mode register contains a field, and
   wherein the value to indicate whether the command is disabled is to be contained in the field.

5. The memory device of claim 1, wherein the instance of the command is acquired via a bus.

6. The memory device of claim 5, wherein the instance of the command is generated by a memory controller, and
   wherein the memory controller is to transfer the instance of the command via the bus to the memory device.

7. The memory device of claim 6, wherein the memory controller is associated with processing logic contained in a computing device.

8. The memory device of claim 1, wherein the device processing logic is to further:
   acquire an instance of a second command and the value, and
   execute the instance of the second command, the execution of the instance of the second command including setting the value in the mode register.

9. The memory device of claim 1, wherein the command is a vendor specific command.

10. The memory device of claim 1,
    wherein responsive to an occurrence of an event to cause the command to no longer be disabled, the mode register is set to a value that indicates the command is not disabled.

11. The memory device of claim 10, wherein the event is a power-cycling of the memory device or a reset of the memory device.

12. The memory device of claim 1, wherein execution of the instance of the PPR command is to remap a row of memory cells of the memory device.

13. A computing device comprising:
    a memory device;
    a mode register to contain a value to indicate whether a post package repair (PPR) command is disabled for the memory device; and
    device processing logic to:
       acquire an instance of the PPR command, and
       selectively execute or discard the instance of the PPR command based in part on the value in the mode register.

14. The computing device of claim 13, wherein the mode register and the device processing logic are contained in the memory device.

15. The computing device of claim 13, further comprising:
    a memory controller to generate an instance of the command, and
    a bus to transfer the instance of the command from the memory controller to the memory device.

16. The computing device of claim 13, wherein the device processing logic is to:
    execute the instance of the PPR command based in part on a determination that the value in the mode register indicates that the PPR command is not disabled.

17. The computing device of claim 13, wherein the device processing logic further:
    discard the instance of the PPR command based in part on a determination that the value in the mode register indicates that the PPR command is disabled.

18. The computing device of claim 13, wherein the command is a vendor specific command.

19. The computing device of claim 13, wherein the device processing logic is to further:
  acquire an instance of a second command and the value, and
  execute the instance of the second command, the execution of the instance of the second command including setting the value in the mode register.

* * * * *